(12) United States Patent
Carlson

(10) Patent No.: US 6,407,551 B1
(45) Date of Patent: Jun. 18, 2002

(54) DEVICE FOR TESTING A SOLID STATE GLOW PLUG CONTROLLER

(75) Inventor: Joseph R. Carlson, Berkley, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/438,760

(22) Filed: Nov. 11, 1999

Related U.S. Application Data

(60) Provisional application No. 60/107,930, filed on Nov. 11, 1998.

(51) Int. Cl.[7] .................................................. F02P 17/00
(52) U.S. Cl. ...................................... 324/395; 324/158.1
(58) Field of Search ......................... 324/395, 300–400, 324/66, 158.1; 123/145 A; 219/497; 701/99

(56) References Cited

U.S. PATENT DOCUMENTS

| | | | |
|---|---|---|---|
| 4,500,775 A | 2/1985 | Sangu et al. ................. 219/497 |
| 4,607,153 A | * 8/1986 | Ang et al. .................... 219/497 |
| 4,673,868 A | 6/1987 | Jones, Jr. ..................... 324/545 |
| 5,032,791 A | * 7/1991 | Bates, Jr. ..................... 324/202 |
| 5,170,125 A | * 12/1992 | Bates, Jr. ..................... 324/537 |
| 5,359,290 A | 10/1994 | Cervas ........................ 324/384 |
| 5,507,255 A | * 4/1996 | Boisvert et al. ............. 123/146 |
| 5,549,478 A | * 8/1996 | McGuire ..................... 439/35 |
| 5,570,666 A | * 11/1996 | Rymut et al. ........... 123/145 A |
| 5,634,443 A | 6/1997 | Mathews ............... 123/179.21 |
| 5,668,312 A | 9/1997 | Kaman ........................ 73/116 |
| 5,729,456 A | * 3/1998 | Boisvert et al. .............. 701/99 |
| 6,148,258 A | * 11/2000 | Boisvert et al. .............. 701/99 |

* cited by examiner

Primary Examiner—Michael J. Sherry
Assistant Examiner—Paresh Patel
(74) Attorney, Agent, or Firm—Thomas N. Twomey

(57) ABSTRACT

A glow plug controller test device including an electrical connector which can be electrically connected to the vehicle wiring harness connector of the glow plug controller. The test device also includes a pair of leads which are connected to the vehicle power supply and ground, respectively. The test device further includes a light emitting diode which flashes as an indication that the glow plug controller is operational.

4 Claims, 4 Drawing Sheets

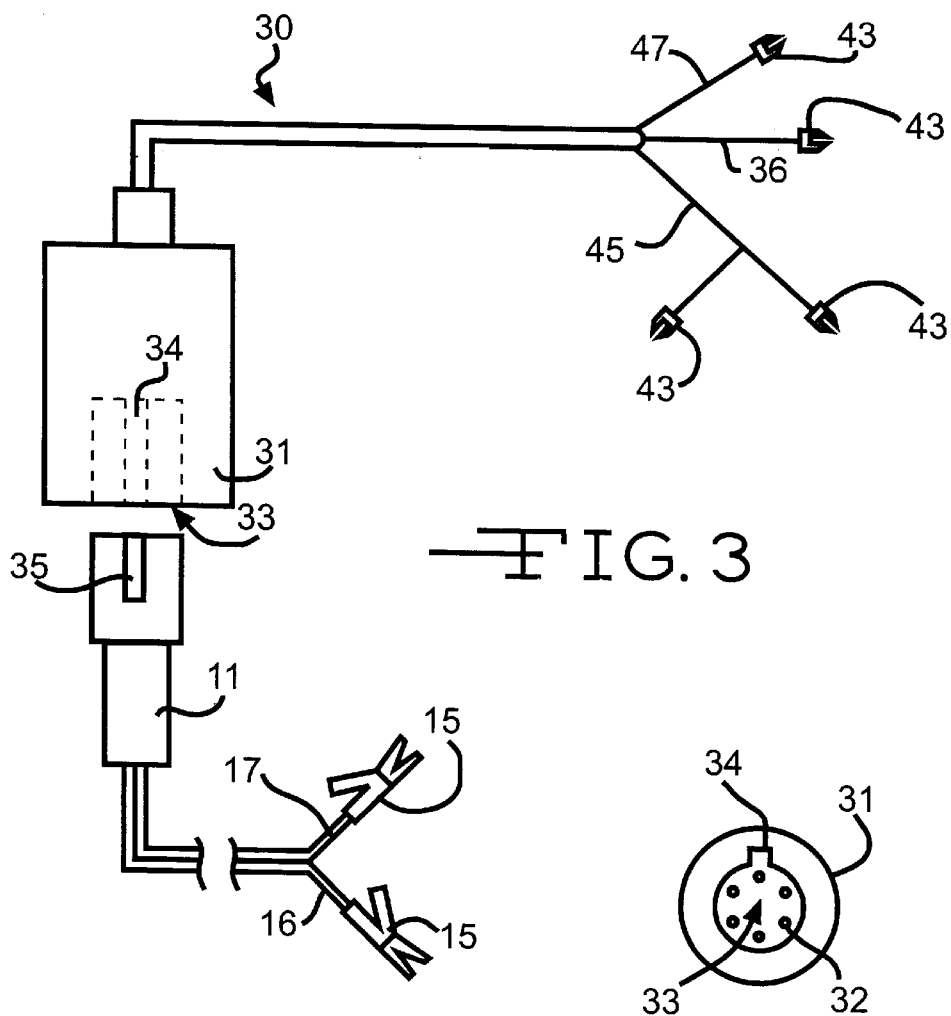
FIG. 3
FIG. 3A
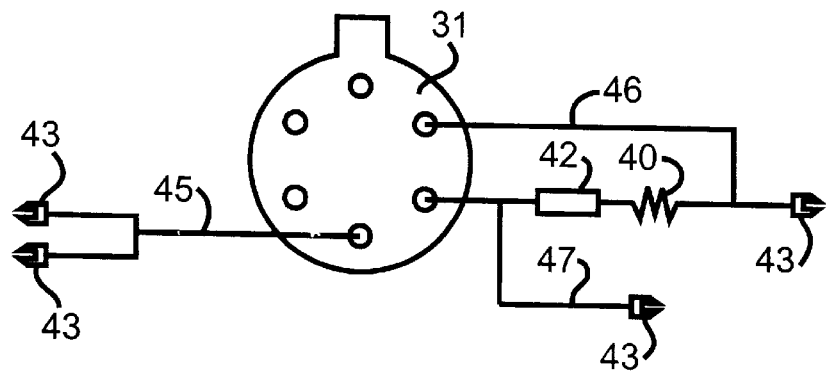
FIG. 4

DEVICE FOR TESTING A SOLID STATE GLOW PLUG CONTROLLER

CROSS REFERENCE TO RELATED APPLICATIONS

This application claims the benefit of U.S. Provisional Application No. 60/107,930, filed Nov. 11, 1998.

BACKGROUND OF THE INVENTION

This invention relates in general to diesel engines for vehicles and in particular to a device for testing a solid state glow plug controller for a diesel engine while the controller remains mounted upon the engine.

Diesel engines do not use spark plugs. Rather, they rely upon compression of an air-fuel mixture by rapid motion of a piston to ignite the fuel in a combustion chamber. However, it is known to use glow plugs to aid combustion during engine start-up. Such glow plugs are typically operated for only a brief time period.

The glow plugs mounted upon a diesel engine are typically controlled by a glow plug controller, which is mounted directly upon the engine block. Upon the vehicle operator turning on the vehicle ignition, the glow plug controller applies a high DC current, often in the neighborhood of 150 amps, to the glow pugs to rapidly heat the combustion chamber. The initial application of current is usually referred to as a "pre-glow" mode of operation. A temperature sensor included in the controller detects the engine temperature and controls the duration of the pre-glow, which typically lasts from three to eight seconds.

Following the pre-glow portion of the engine starting cycle, the controller transitions to an "after-glow" mode of operation. During the after-glow portion of the engine starting cycle, the controller generates a pulsed voltage which is applied to the glow plugs. The duration of after-glow is a function of the sensed engine temperature. It is known for a controller to reduce the duty cycle of pulsed voltage as the engine temperature approaches glow plug cut-off.

Because of thee currents drawn by the glow plugs, the output voltage generated by the controller is typically applied to the coil of an electro-mechanical relay. The electro-mechanical relay is connected between the power supply and the glow plugs and regulates the actual glow plug current. Typically, the electro-mechanical relay is located remotely from the glow plug controller to protect the unit from the engine heat; however, the relay can be included in the controller.

SUMMARY OF THE INVENTION

This invention relates to a device for testing a solid state glow plug controller while the controller remains mounted upon a diesel engine.

When a diesel engine fails to start, the problem is often due to failed glow plugs or a failed glow plug controller. In order to test a glow plug controller, it is necessary to remove the unit from the vehicle engine. Accordingly, it would be desirable to provide a device for testing a glow plug controller while the controller remains mounted upon the engine.

The present invention contemplates a test device which includes a connector adapted to be electrically connected to the glow plug electrical connector. The test device also includes a first lead extending from the connector which is adapted to be connected to a vehicle power supply, and a second lead also extending from the connector which is adapted to be connected to a vehicle ground. A visual display is mounted upon the connector and electrically connected to the second lead. When the test device is connected the glow plug controller, the visual display is electrically connected through the glow plug controller to the power supply and is operative to indicate the condition of the glow plug controller.

In the preferred embodiment, the visual display included a light emitting diode connected in series with a load resistor. Flashing of the light emitting diode is an indication that the glow plug controller is functional.

Also in the preferred embodiment, the test device electrical connector is a female connector having a plurality of sockets and the first lead is connected to a first socket and a second socket in the connector. The light emitting diode has an anode and a cathode with the anode connected to a third socket in the female connector. Additionally, the load resistor has a first end and a second end with the first end connected to the diode cathode and the second end connected to the second lead, the second lead being connected to a fourth socket in the female connector.

The invention further contemplates an adapter for using the test device with a glow plug controller having a female electrical connector. The adapter includes a male connector having a plurality of pins which are received by the sockets in the test device female electrical connector and a plurality of leads which are adapted to be connected to the female electrical connector for the glow plug controller. The adapter includes an adapter load resistor which is adapted to be connected between the voltage output socket of the glow plug controller and ground. The adapter also can include an optional thermistor which, when included, is connected between the adapter load resistor and ground.

The invention also contemplates a procedure for testing a glow plug controller which is mounted upon a vehicle engine. The procedure includes the steps of disconnecting the vehicle wiring harness from the electrical connector for the glow plug controller being tested and connecting the electrical connector of the test device described above to the glow plug controller electrical connector. One of the test device leads is connected to the vehicle power supply and the other of the test device leads is connected to the vehicle ground. The visual indicator is then observed to determine that the glow plug controller is functioning properly. The above procedure is modified when the test device electrical connector is not compatible with the glow plug controller electrical connector by inserting the adapter described above between the test device and the glow plug controller electrical connector.

Various objects and advantages of this invention will become apparent to those skilled in the art from the following detailed description of the preferred embodiment, when read in light of the accompanying drawings.

BRIEF DESCRIPTION OF THE DRAWINGS

FIG. 3 illustrates an adapter for the test device shown in FIG. 1.

FIG. 3A is an end view of the adapter shown in FIG. 3.

FIG. 4 is a schematic circuit diagram for the adapter shown in FIG. 3.

DETAILED DESCRIPTION OF THE PREFERRED EMBODIMENT

Figure 1:
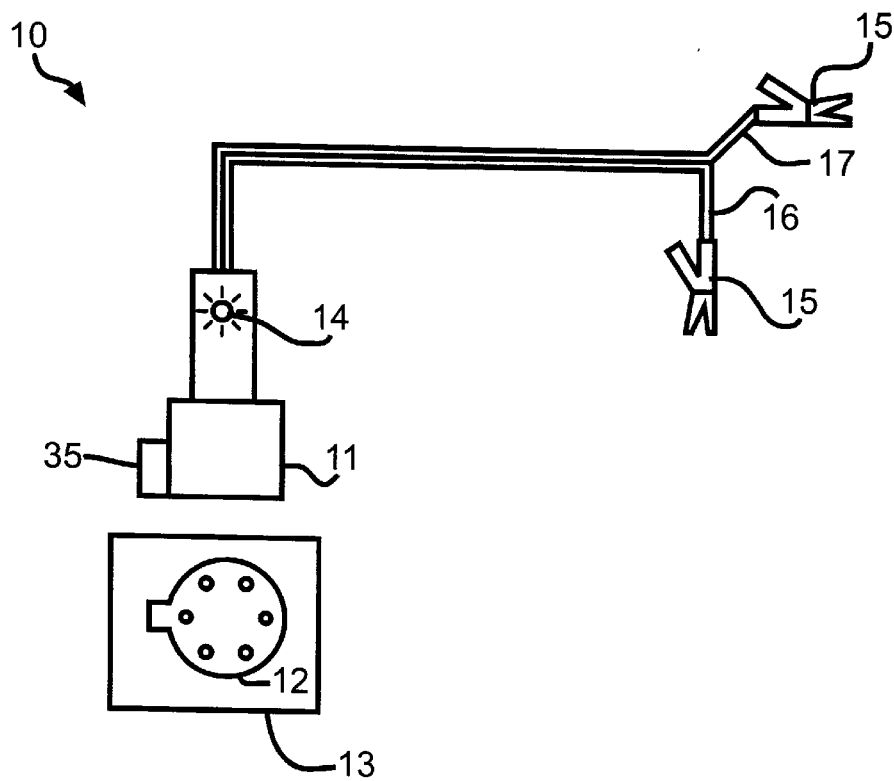
FIG. 1 illustrates a test device for a solid state glow plug controller in accordance with the invention.

Referring now to the drawings, there is illustrated, generally at 10 in FIG. 1, a compact device for testing a glow plug controller for a diesel engine. The test device 10 includes a six socket female connector 11 which receives corresponding pins extending from a male electrical connector 12 for an electronic glow plug controller 13. The male glow plug controller would normally receive a connector for the vehicle wiring harness. The glow plug controller 13 is mounted upon a diesel engine (not shown). The connector 11, which corresponds to the glow plug controller 13 being tested, carries a Light Emitting Diode (LED) 14 as a visual indicator. The connector 11 is encapsulated in a conventional electrically insulative material, such as plastic or rubber. A pair of leads, which, in the preferred embodiment, are formed from 18 gauge wire and are five feet long, extend from the connector 11. Each of the leads terminates in a conventional alligator clip 15. A first lead, 16 is connected to a positive terminal of the vehicle battery (not shown) while a second lead 17 is connected to the vehicle ground, or to the negative terminal of the vehicle battery. Accordingly, the first lead 16 will be referred to as a power supply lead in the following. Similarly, the second lead 17 will be referred to as a ground lead. The handle portions of the alligator clips 15 are hooded with a stretchable conventional material which is electrically insulative. The material is color coded to identify the lead, with red indicating the power supply lead 16 and black indicating the ground lead 17.

Figure 2:
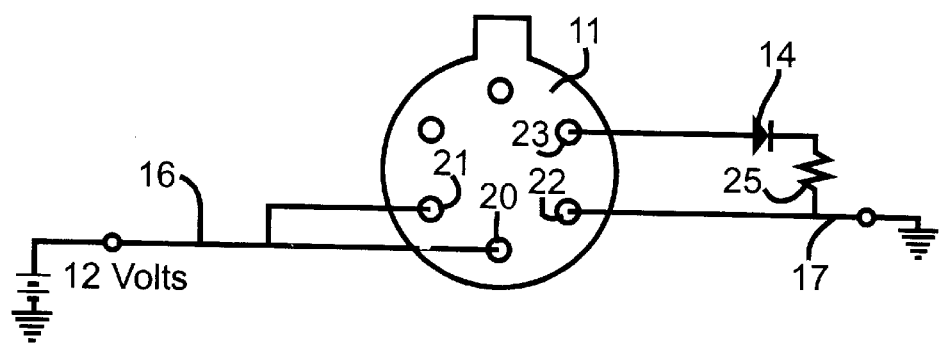
FIG. 2 is a schematic circuit diagram for the test device shown in FIG. 1.

A schematic circuit diagram of the test device 10 is shown in FIG. 2. Components shown in FIG. 2 which are similar to components in FIG. 1 have the same numerical designators. As shown in FIG. 2, the power supply lead 16 is connected to two input sockets 20 and 21 of the test device connector 11. One of the input sockets 20 provides power to the glow plug controller 13. The other input socket 21 represents the voltage supplied to the controller 13 from the engine alternator as an indication that the engine has started. This indication limits the duration of the controller start up cycle.

The ground lead 17 is directly connected to a ground socket 22 of the test device connector 11 which is, in turn, connected to the glow plug controller ground when the test device 10 is connected to the glow plug controller 13. The test device connector 11 includes a controller output voltage socket 23 which is connected to the anode of the LED 14. The cathode of the LED 14 is connected through a load resistor 25 to the ground lead 17. The load resistor 25 and the connection to the ground lead 17 are internal to the test device connector 11. In the preferred embodiment, the load resistor 25 is a 0.20 ohm resistor which is rated at 25 watts; however, it will be appreciated that the invention also can be practiced using a load resistor having other values. The load resistor 25 simulates the relay coil of the electro-mechanical relay (not shown) which regulates the electrical current supplied to the glow plugs.

To operate the test device 10, the vehicle wiring harness is removed from the glow plug controller 13 and the test device 10 is plugged into the controller connector 12. The test device 10 power supply leads 16 and 17 are connected to the vehicle power supply and ground, respectively. The test device 10 supplies power to the glow plug controller 13, which causes the controller 13 to sequence thought an engine starting cycle. If the glow plug controller 13 is functional, an intermittent output voltage will be generated at the controller pin plugged into the voltage output socket 23. The output voltage will cause the LED diode 14 to flash as the controller 13 operates. Alternately, if the LED 14 is constantly illuminated, or not illuminated, it is an indication that the glow plug controller 13 is faulty. Further testing of the glow plug controller 13 can include timing the flashing of the LED 12 and correlating the measured times with the ambient temperature.

Figure 3B:
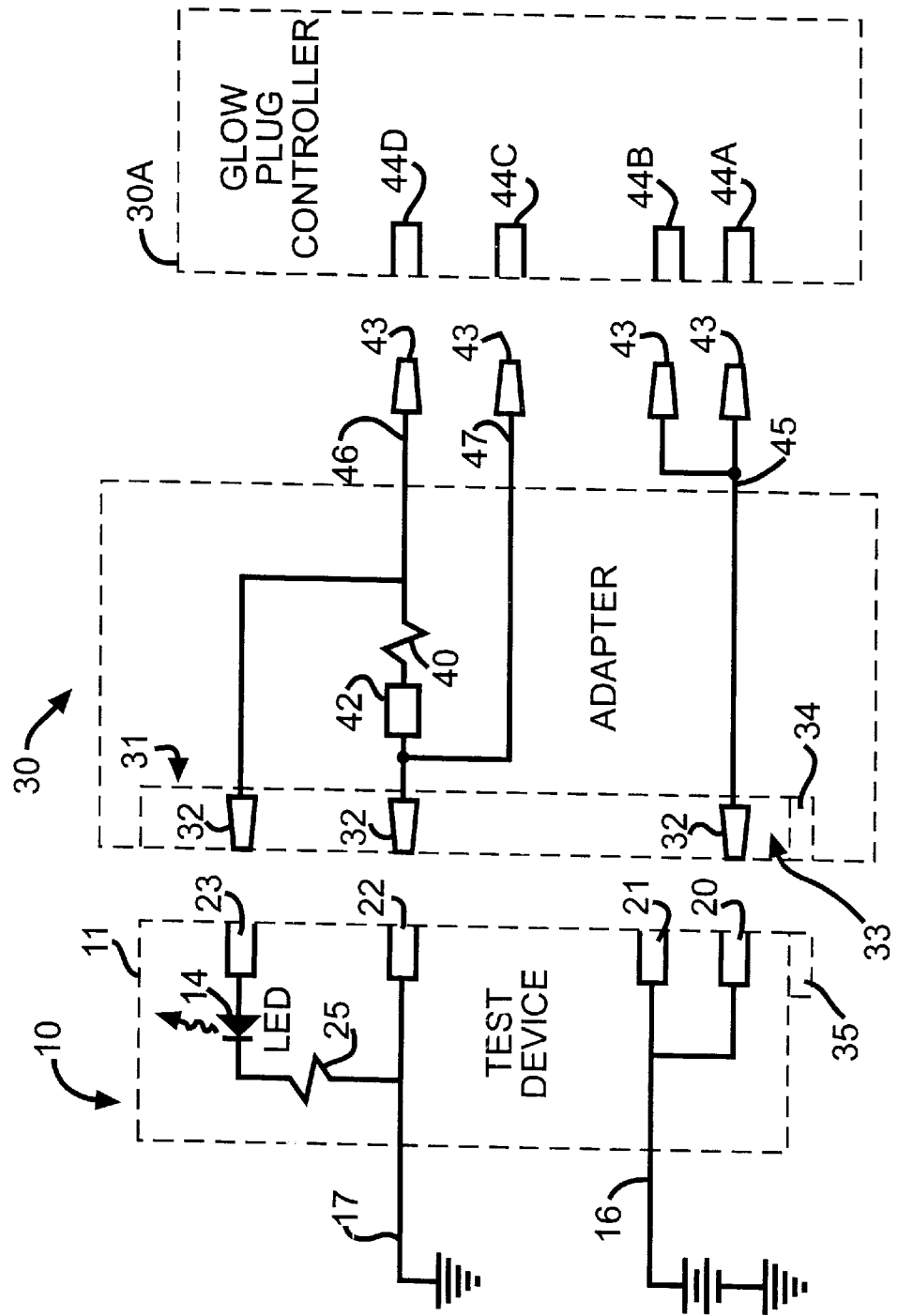
FIG. 3B is a schematic diagram of the adapter and test device shown in FIG. 3.

The invention further contemplates a male extension connector, or adapter, which is shown generally at 30 in FIGS. 3 and 3B. The adapter 30 allows the test device 10 to be connected to a glow plug controller 30A, as shown in FIG. 3B, which includes a mechanical relay. Such glow plug controllers typically have female electrical connectors and supply the full output current directly to the glow plugs.

The adapter 30 includes a male connector 31 having a plurality of pins 32 which correspond to the sockets in the female connector for the test device 10. The pins 32 are recessed within a bore 33 formed in the end of the adapter, as illustrated in FIG. 3A. The end of the test device 10 is inserted into the bore 33, as shown by the small arrow in FIG. 3. A keyway 34 formed in the surface of the bore 33 receives a corresponding key 35 formed upon the surface of the test device connector 11 to assure proper alignment of the pins 32 with the sockets in the test device connector 11.

In the preferred embodiment the adapter 30 also includes a two ohm adapter load resistor 40 which is rated at 2.5 watts; however, it will be appreciated that the invention also can be practiced using an adapter load resistor having different ratings. The load resistor 40, which is shown in the schematic diagram in FIG. 4, simulates the engine glow plugs and dissipates the energy supplied thereto by the glow plug controller. An optional thermistor 42 also can be included. When included, the thermistor 42 is connected between the adapter load resistor 40 and ground. The thermistor 42 opens upon its temperature reaching a threshold temperature to protect the test device and adapter 10 and 30 from overheating due to the large glow plug current supplied by the controller.

A plurality of leads, each of which terminates in a stud connector 43, extend from the adapter 30. In the preferred embodiment, the leads are three feet long. The invention contemplates that the stud connectors 43 are plugged into sockets 44 of the female electrical connector for the glow plug controller 30A. As described above, the pins 32 of the adapter male connector 31 are inserted into corresponding sockets in the test device connector 11. As shown in FIG. 4, a first lead 45 is divided to terminate in two connectors 43, which are inserted into a first and a second glow plug controller input socket 44A and 44B, respectively. As described above, one of the input sockets provides power to the glow plug controller while the other input socket represents the voltage supplied to the controller from the engine alternator. Similarly, the connector 43 at the end of a second lead 46 is inserted into a glow plug controller output socket 44D to sense the output voltage generated by the controller.

The connector 43 at the end of a ground lead 47 is inserted into a controller ground socket 44C. Accordingly, the controller output voltage is applied through the adapter 31 and across the LED 14 and test device load resistor 25. In the preferred embodiment, the leads 45, 46 and 47 and the corresponding glow plug controller sockets 44 are color coded to facilitate the connection. Alternately, the leads 45, 46 and 47 can be terminated upon a male connector (not shown) which corresponds to the female glow plug controller connector. The adapter load resistor 40 is connected between the output lead 46 and the ground lead 47. The operation of the test device 10 with the adapter 30 is the same as described above.

Figure 5:
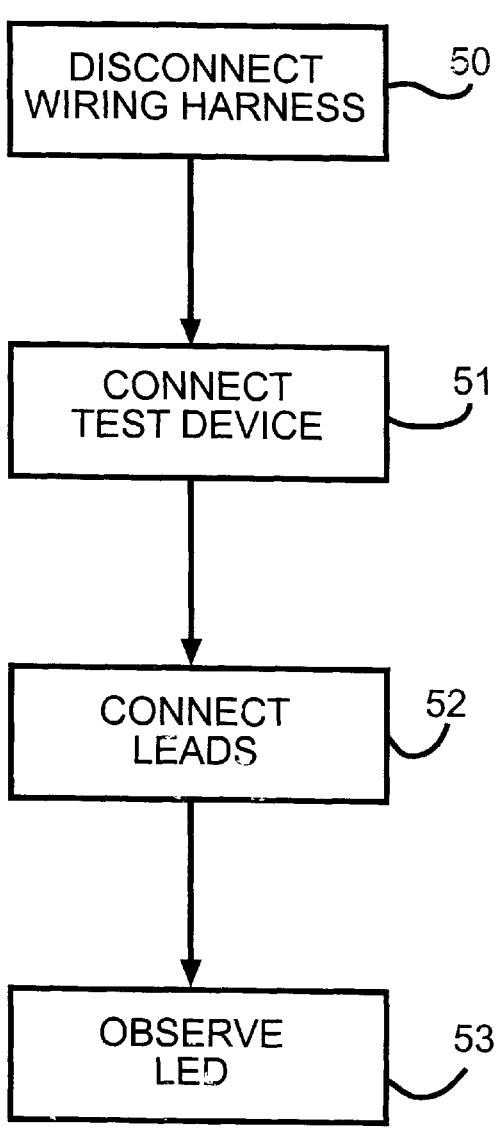
FIG. 5 is a flow chart for a procedure for testing a solid state glow plug controller with the test device shown in FIG. 1.

The invention further contemplates a procedure for testing a solid state glow plug controller while the controller remains mounted upon a vehicle engine. The procedure is illustrated by the flow chart shown in FIG. 5. In functional block 50, the vehicle wiring harness is disconnected from the glow plug controller. In functional block 51, the test device 10 is plugged into the glow plug controller connector. The test device power leads, 16 and 17, are connected to the vehicle power supply and ground, respectively, in functional block 52. In functional block 53, the LED 14 is observed and the condition of the controller determined.

Figure 6:
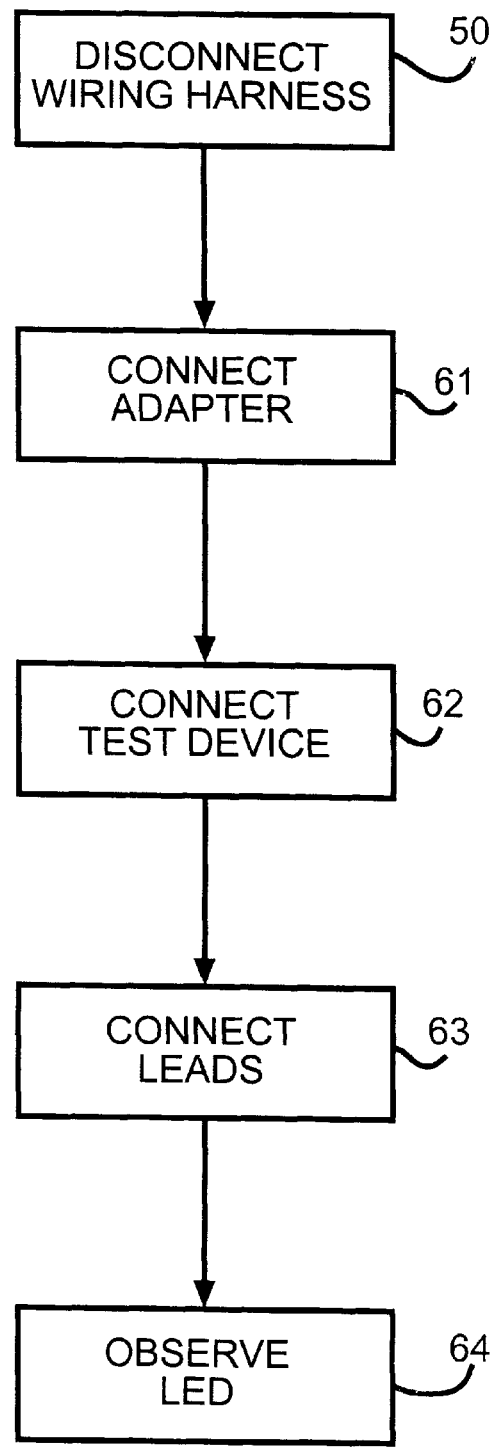
FIG. 6 is a flow chart for a procedure for testing a solid state glow plug controller with the adapter shown in FIG. 3.

A flow chart for a test procedure which includes the test device adapter 30 is shown in FIG. 6. In functional block 60, the vehicle wiring harness is disconnected from the glow plug controller. In functional block 61, the adapter leads, 45, 46 and 47 are plugged into corresponding sockets in the glow plug controller connector. In functional block 62, the adapter 30 is plugged into the test device 10. The test device power leads, 16 and 17, are connected to the vehicle power supply and ground, respectively, in functional block 63. In functional block 64, the LED 14 is observed and the condition of the controller determined.

Thus, the present invention provides a compact device for testing a glow plug controller while the controller remains mounted upon a diesel engine. Because the vehicle power supply is used, the test device 10 can be easily used in the field.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope. For example, while six pin and six socket connectors have been illustrated, the invention also can be practiced utilizing connectors having more or less pins and sockets.

What is claimed is:

1. A test device for a glow plug controller which is mounted upon a vehicle engine, the glow plug controller including a female electrical connector, the test device comprising:

a female connector having a plurality of sockets;

a first lead connected to a first socket and a second socket of said female connector, said first lead extending from said female connector and being adapted to be connected to a vehicle power supply;

a second lead connected to a third socket of said female adapter, said second lead extending from said female connector and being adapted to be connected to a vehicle ground;

a light emitting diode having an anode and a cathode, said anode connected to a fourth socket of said female connector;

a tester load resistor having a first end connected to said cathode of said light emitting diode and a second end connected to said second lead;

an adapter that includes a male connector having a plurality of pins which are received by said sockets in said female connector, said adapter also including a plurality of leads, each of said leads from said adapter terminating in a stud connector, said stud connectors being adapted to be inserted into corresponding sockets in the glow plug female electrical connector; and an adapter load resistor having a first end that is adapted to be connected to a voltage output socket of the glow plug controller and a second end connected to ground, said light emitting diode being electrically connected through said adapter and the glow plug controller when the test device is connected thereto and flashing to indicate the condition of the glow plug controller.

2. A test device according to claim 1 wherein said adapter male connector is a first male connector and further wherein said stud connectors are included upon a second male connector, said second male connector adapted to be connected to said glow plug female connector.

3. A test device according to claim 1 further including a thermister connected between said adapter load resistor and ground.

4. A test device according to claim 1 wherein a flashing light emitting diode while the tester remains connected to the glow plug controller and the vehicle power supply and ground indicates that the glow plug controller is operative.

* * * * *